(12) United States Patent
Wang

(10) Patent No.: US 11,811,422 B2
(45) Date of Patent: Nov. 7, 2023

(54) INFORMATION PROCESSING METHOD AND DEVICE AND COMPUTER STORAGE MEDIUM

(71) Applicant: SANECHIPS TECHNOLOGY CO., LTD., Shenzhen (CN)

(72) Inventor: Huayong Wang, Shenzhen (CN)

(73) Assignee: SANECHIPS TECHNOLOGY CO., LTD., Shenzhen (CN)

(*) Notice: Subject to any disclaimer, the term of this patent is extended or adjusted under 35 U.S.C. 154(b) by 73 days.

(21) Appl. No.: 17/413,089

(22) PCT Filed: Dec. 12, 2019

(86) PCT No.: PCT/CN2019/124934
§ 371 (c)(1),
(2) Date: Jun. 11, 2021

(87) PCT Pub. No.: WO2020/119770
PCT Pub. Date: Jun. 18, 2020

(65) Prior Publication Data
US 2022/0321145 A1    Oct. 6, 2022

(30) Foreign Application Priority Data
Dec. 14, 2018  (CN) .................. 201811534786.X

(51) Int. Cl.
*H03M 13/11*    (2006.01)
(52) U.S. Cl.
CPC ...... *H03M 13/1168* (2013.01); *H03M 13/114* (2013.01); *H03M 13/1108* (2013.01); *H03M 13/1137* (2013.01)

(58) Field of Classification Search
CPC ........ H03M 13/1168; H03M 13/1108; H03M 13/1137; H03M 13/114; H03M 13/116
See application file for complete search history.

(56) References Cited

U.S. PATENT DOCUMENTS 8,418,023 B2 *  4/2013  Gunnam ............ H03M 13/1177
                                                       714/755
10,394,613 B2 *  8/2019  Grube .................. G06F 9/5083
(Continued)

FOREIGN PATENT DOCUMENTS

CA    3051761 A1 *  11/2018  ............ H03M 13/11
CA    3051761 A1    11/2018
(Continued)

OTHER PUBLICATIONS

International Search Report for corresponding application PCT/CN2019/124934 filed Dec. 12, 2020; dated Mar. 9, 2020.
(Continued)

*Primary Examiner* — Steve N Nguyen
(74) *Attorney, Agent, or Firm* — CANTOR COLBURN LLP

(57) ABSTRACT

Provided is an information processing method. The method includes that: first data to be decoded and one or more decoding parameters of the first data are obtained; a basis matrix is determined based on the one or more decoding parameters; a decoding instruction set including a plurality of decoding instructions is determined based on the basis matrix, wherein the plurality of decoding instructions include elements in the basis matrix; and the first data is decoded based on the decoding instruction set. Further provided are an information processing device and a computer storage medium.

22 Claims, 5 Drawing Sheets

(56) References Cited

U.S. PATENT DOCUMENTS

| | | | | |
|---|---|---|---|---|
| 10,833,704 B1* | 11/2020 | Walke | ............... | H03M 13/6519 |
| 2007/0136635 A1* | 6/2007 | Niu | ................... | H03M 13/6393 |
| | | | | 714/752 |
| 2010/0275089 A1* | 10/2010 | Mow | ....................... | H04L 1/005 |
| | | | | 714/790 |
| 2011/0289382 A1* | 11/2011 | Shih | ................... | H03M 13/1137 |
| | | | | 714/763 |
| 2013/0086445 A1* | 4/2013 | Yedidia | ................ | H03M 13/116 |
| | | | | 714/755 |
| 2017/0047947 A1* | 2/2017 | Hong | ................ | H03M 13/2906 |
| 2019/0349006 A1* | 11/2019 | Ma | ..................... | H03M 13/616 |

FOREIGN PATENT DOCUMENTS

| | | |
|---|---|---|
| CN | 105207680 A | 12/2015 |
| CN | 107947802 A | 4/2018 |
| CN | 108023598 A | 5/2018 |
| CN | 108347297 A | 7/2018 |
| WO | 2018032518 A1 | 2/2018 |
| WO | 2018202143 A1 | 11/2018 |

OTHER PUBLICATIONS

"3rd Generation Partnership Project; Technical Specification Group Radio Access Network; NR; Multiplexing and Channel Coding (Release 15)", vol. RAN WG1, No. V0.0.1, Aug. 12, 2017, pp. 1-23 XP051336737.

European Search Report for corresponding application 19 895 135.2; Report dated Dec. 1, 2021.

Mediatek Inc., "On design and performance of NR eMBB LDPC Code", 3GPP TSG-RAN WG1 Meeting #89, Hangzhou, CN, May 15-19, 2017, R1-1709856.

* cited by examiner

Fig. 3

|   | 0 | 1 | 2 | 3 | 4 | 5 | 6 | 7 | 8 |
|---|---|---|---|---|---|---|---|---|---|
| Row 0 → | Column No. 1 |  | Column No. 2 |  |  |  |  | Column No. M0 |  |
| Row 1 → |  |  | Column No. 1 |  | Column No. 2 |  |  |  | Column No. M1 |
|  |  |  |  |  |  |  |  |  |  |

(1) Sparse matrix

| Row 0 → | Weight M0 |
|---|---|
| Row 1 → | Weight M1 |
|  |  |

(2) Weight table

| Column No. 1 | Group 1 | Group 2 |  | Group N |
|---|---|---|---|---|
| Column No. 2 | Group 1 | Group 2 |  | Group N |
|  |  |  |  |  |
| Column No. M0 | Group 1 | Group 2 |  | Group N |
| Column No. 1 | Group 1 | Group 2 |  | Group N |
|  |  |  |  |  |
| Column No. M1 | Group 1 | Group 2 |  | Group N |
|  |  |  |  |  |

(3) Element table

Fig. 4

| | Execution character | Reserved character | First valid element | Second valid element | Column serial number of each of the third type of elements | Shift value of each of the third type of elements |
|---|---|---|---|---|---|---|
| Instruction 1 | Execution character | Reserved character | First valid element | Second valid element | Column serial number of each of the third type of elements | Shift value of each of the third type of elements |
| Instruction 2 | Execution character | Reserved character | First valid element | Second valid element | Column serial number of each of the third type of elements | Shift value of each of the third type of elements |
|  |  |  |  |  |  |  |
| Instruction N | Execution character | Reserved character | First valid element | Second valid element | Column serial number of each of the third type of elements | Shift value of each of the third type of elements |

INFORMATION PROCESSING METHOD AND DEVICE AND COMPUTER STORAGE MEDIUM

CROSS-REFERENCE TO RELATED APPLICATION

The present application is a national stage filing of the PCT International Application No. PCT/CN2019/124934 filed on Dec. 12, 2019, which claims priority to Chinese Patent Application No. 201811534786.X, filed to the China National Intellectual Property Administration on Dec. 14, 2018, the disclosure of which is hereby incorporated by reference in its entirety.

TECHNICAL FIELD

The present application relates to the field of electronic information technologies, for example, to an information processing method and device and a computer storage medium.

BACKGROUND

In a digital communication system, there are generally three parts: sender, channel and receiver. The sender can obtain a coded codeword by performing channel coding on an information sequence, interweave the coded codeword, map an interwoven bit into a modulation symbol, and then process and send the modulation symbol according to communication channel information. In a channel, due to multiple paths, movement and other factors resulting in a specific channel response, data transmission distortion will be distorted, and at the same time, due to noise and interference, the data transmission will be further deteriorated. The receiver receives modulation symbol data which is transmitted through the channel and subjected to distortion, and special processing is needed to restore the original information sequence.

According to data to be decoded obtained by the sender by applying a coding method on the information sequence, the receiver may process the data to be decoded accordingly to reliably restore the original information sequence. The coding method needs to be visible for both the receiver and the sender. Generally, the coding method is based on Forward Error Correction (FEC) coding. The FEC coding adds some redundant information to the information sequence, and the receiver may use the redundant information to reliably restore the original information sequence.

In the related art, when decoding the data to be decoded, a decoder can only decode the data to be decoded according to a predetermined decoding matrix stored in the decoder. That is, the decoder in the related art can only decode the data to be decoded corresponding to a predetermined decoding parameter which corresponds to the predetermined decoding matrix, but when the decoding parameter corresponding to the data to be decoded is not the predetermined decoding parameter, the problem that decoding cannot be performed or decoding performance cannot be met will occur.

SUMMARY

Embodiments of the present application provide an information processing method and device and a computer storage medium, which can address the problem in the related art that when a decoding parameter corresponding to data to be decoded is not a predetermined decoding parameter, decoding cannot be performed or decoding performance cannot be met.

The embodiments of the present application provide an information processing method, which may include the following operations.

First data to be decoded and one or more decoding parameters of the first data are obtained.

A basis matrix is determined based on the one or more decoding parameters.

A decoding instruction set including a plurality of decoding instructions is determined based on the basis matrix, the plurality of decoding instructions including elements in the basis matrix.

The first data is decoded based on the decoding instruction set.

The embodiments of the present application provide an information processing device, which may include: a processor, a memory and a communication bus.

The communication bus is configured to realize a communication connection between the processor and the memory.

The processor is configured to execute a program of the information processing method in the memory to implement the following operations.

The first data to be decoded and the one or more decoding parameters of the first data are obtained.

The basis matrix is determined based on the one or more decoding parameters.

The decoding instruction set including the plurality of decoding instructions is determined based on the basis matrix, the plurality of decoding instructions including the element in the basis matrix.

The first data is decoded based on the decoding instruction set.

The embodiments of the present application provide a computer storage medium, which stores one or more than one program. The one or more than one program may be executed by one or more than one processor to implement the information processing method.

BRIEF DESCRIPTION OF THE DRAWINGS

FIG. 3 is a schematic diagram of a storage structure of a first initial matrix provided by an embodiment of the present application.

FIG. 4 is a schematic diagram of a storage structure of a decoding instruction set provided by an embodiment of the present application.

DETAILED DESCRIPTION OF THE EMBODIMENTS

The technical solutions in the embodiments of the present application are described below in combination with the accompanying drawings in the embodiments of the present application.

"The embodiments of the present application" or "the above embodiments" mentioned in the whole specification mean that specific features, structures or characteristics related to the embodiment is included in at least one embodiment of the present application. Therefore, "in the embodiments of the present application" or "in the above embodiments" appearing in many places of the whole specification does not always refer to the same embodiment. In addition, these specific features, structures or characteristics may be combined in one or more embodiments in any proper manner. In the embodiments of the present application, the serial numbers of a plurality of processes do not mean an execution sequence and the execution sequence of the plurality of processes should be determined by their functions and internal logic and should not form any limit to an implementation process of the embodiments of the present application. The sequence numbers of the embodiments of the present application are just for describing, instead of representing superiority-inferiority of the embodiments.

An information processing method provided by the embodiments of the present application may be applied to either a New Radio Access Technology (RAT) communication system, or a Long Term Evolution (LTE) mobile communication system, or a fifth-generation mobile communication system, or other wireless/wired communication systems.

Figure 1:
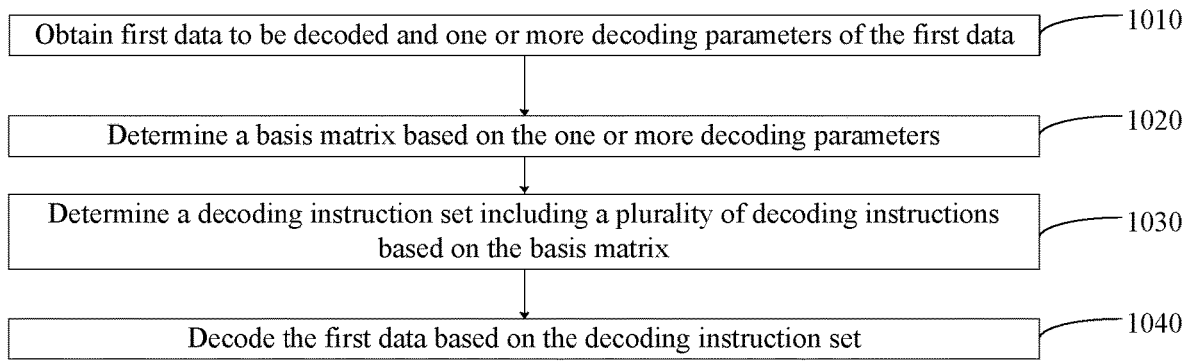
FIG. 1 is a flowchart of an information processing method provided by an embodiment of the present application.

The embodiments of the present application provide an information processing method, which is performed by an information processing device. As shown in FIG. 1, the method includes the following operations.

At operation 1010, first data to be decoded and one or more decoding parameters of the first data are obtained.

The information processing device in the embodiments of the present application may be a decoder or a device with a decoding function. The decoder may be a Low-Density Parity-Check (LDPC) decoder or other types of decoders, which is not limited here.

The first data to be decoded may be an information bit sequence to be decoded. The one or more decoding parameters of the first data during decoding may include at least one of the following: decoding parallelism; an operating mode corresponding to an information bit sequence; an application scenario corresponding to the information bit sequence; a link direction corresponding to the information bit sequence; the type of user equipment; length information of the information bit sequence or a data block size, a frequency band, a code rate and a bandwidth; a Modulation and Coding Scheme (MCS) level of the information bit sequence; an aggregation level of a Control Channel Element (CCE) of the information bit sequence; a search space corresponding to the information bit sequence; a scrambling mode of the information bit sequence; a Cyclic Redundancy Check (CRC) format of the information bit sequence and a channel type of the information bit sequence; a control information format corresponding to the information bit sequence; a Channel State Information (CSI) process corresponding to the information bit sequence; a subframe index number of the information bit sequence; a carrier frequency corresponding to the information bit sequence; a distribution of the information bit sequence; the coverage of the information bit sequence; a length of a rate matching output sequence obtained by performing quasi-cyclic LDPC decoding and bit selection on the information bit sequence; a code rate of the rate matching output sequence; a combination of the code rate of the rate matching output sequence and the length of the rate matching output sequence; a combination of the code rate of the rate matching output sequence and the length of the information bit sequence; and a Hybrid Automatic Repeat Request (HARQ) data transmission version number of the information bit sequence.

In some embodiments, the decoding parallelism is the maximum number of decoding instructions that can be executed by the information processing device at one time. The operating mode may be an operation mode among in-band operating mode, out-of-band operating mode and independent operating mode. The application scenario may be an application scenario among an Enhanced Mobile BroadBand (EMBB) scenario, an Ultra-Reliable Low-Latency Communications (uRRLC) scenario or a Massive Machine-Type Communications (mMTC) scenario. The link direction may include an uplink data direction and a downlink data direction.

In some exemplary implementations, at least one of the following may also be obtained based on the one or more decoding parameters: a total number of rows and a total number of columns in the basis matrix; a core matrix check block structure of the basis matrix; orthogonality of the basis matrix; properties of the basis matrix; the maximum number of system columns of the basis matrix; the total number of rows and columns in a first initial matrix corresponding to the basis matrix, and values of elements in the first initial matrix; the maximum number of system columns of the LDPC coding; the number of basis matrices; an element correction method of the basis matrix; the number of edges in the basis matrix; the minimum code rate of the basis matrix under the maximum information bit sequence length; the minimum code rate of the basis matrix under shortened coding; a method for setting a boost value; a method for setting the granularity of the boost value; the maximum value of the boost value; the number of no transmission of a system column of the rate matching output sequence obtained by performing the LDPC coding and bit selection on the information bit sequence; a method for punching a check column of the rate matching output sequence; a method for interleaving the rate matching output sequence; a starting bit position of bit selection of the rate matching output sequence; the maximum information length supported by the LDPC coding; a method for setting a value of information bit length supported by the LDPC coding; a method for setting the value of granularity of the information bit length supported by the LDPC coding; the maximum number of columns of the shortened coding of the LDPC coding; a HARQ merging mode of the LDPC coding; a starting position of bit selection of the rate matching output sequence; the maximum number of HARQ transmissions of the LDPC coding; and the number of HARQ transmission versions of the LDPC coding. The basis matrix may be either a first basis matrix or a second basis matrix as follows.

In the embodiments of the present application, at least one of the following may also be obtained based on the one or more decoding parameters: the first basis matrix (including the number of rows and the number of columns of the first basis matrix); the second basis matrix (including the number of rows and the number of columns of the second basis matrix); the distribution of 0 elements and 1 elements in the first basis matrix; the distribution of 0 elements and 1 elements in the second basis matrix; at least one first initial matrix corresponding to the first basis matrix; the distribution of −1, 0 and positive integer elements in each first initial matrix; at least one second initial matrix corresponding to the second basis matrix; and the distribution of −1, 0 and positive integer elements in each second initial matrix. In some embodiments, at least one first initial matrix corresponding to the first basis matrix may be eight first initial matrices corresponding to the first basis matrix, and at least one second initial matrix corresponding to the second basis matrix may be eight second initial matrices corresponding to the second basis matrix. The −1 elements mentioned in the embodiments of the present application are the elements with a value of −1 in the matrix, the 0 elements are the elements with a value of 0 in the matrix, and the positive integer elements are the elements with a value of positive integer in the matrix.

At operation 1020, a basis matrix is determined based on the one or more decoding parameters.

The basis matrix is used to decode the first data. The number of rows and the number of columns of the basis matrix may be determined based on the data block size and the code rate in the decoding parameters. In the embodiments of the present application, the basis matrix is generated according to the one or more decoding parameters, that is, the information processing device will determine different basis matrices according to different decoding parameters.

The basis matrix is used to generate a decoding matrix or a check matrix, so that the information processing device may decode the first data based on the decoding matrix or the check matrix. In some embodiments, the decoding matrix or the check matrix may be generated through the basis matrix and the expansion factor. The expansion factor Z may be determined based on the decoding parameter. The value in the basis matrix is an integer greater than or equal to −1. The −1 in the basis matrix represents a Z-order zero matrix. The 0 in the basis matrix represents a Z-order unit matrix. The positive integer in the basis matrix represents a matrix obtained by shifting the unit matrix right the positive integer times. The expansion factor Z, the data block size and the code rate jointly determine the size of the decoding matrix or check matrix.

At operation 1030, a decoding instruction set including a plurality of decoding instructions is determined based on the basis matrix.

In some embodiments, the decoding instruction is used to call the element in the basis matrix. In some embodiments, the decoding instruction is used to call a valid element in the basis matrix. The decoding instruction set may call all the valid elements in the basis matrix. In some embodiments, the valid element in the basis matrix may be the element whose value is not −1 in the basis matrix.

In the embodiments of the present application, the number of decoding instructions in the decoding instruction set may be obtained according to the number of rows and the number of columns of the basis matrix and the decoding parallelism. For example, when the decoding matrix has m rows and n columns, and the decoding parallelism is n/p, where p is a decoding cycle, the number of decoding instructions in the decoding instruction set may be m×p. The decoding cycle is used to represent the number of times required to call the decoding instruction set. For example, if the decoding cycle is 3, the information processing device can complete the call to the decoding instruction set in three times of calling.

At operation 1040, the first data is decoded based on the decoding instruction set.

The operation that the first data is decoded based on the decoding instruction set may include that: the valid elements in the basis matrix are called based on the decoding instruction set, the decoding matrix is generated based on the valid elements, and the first data is decoded based on the decoding matrix.

The information processing method provided by the embodiments of the present application can flexibly determine, based on the first data to be decoded and the one or more decoding parameters of the first data during decoding, the decoding instruction set used to decode the first data, so that when the first data is decoded through the decoding instruction set, the problem that when the decoding parameter corresponding to the data to be decoded is not a predetermined decoding parameter, decoding cannot be performed or decoding performance cannot be met can be addressed. Therefore, the information processing method provided by the embodiments of the present application can improve the accuracy of decoding and meet the decoding performance for different decoding parameters.

Figure 2:
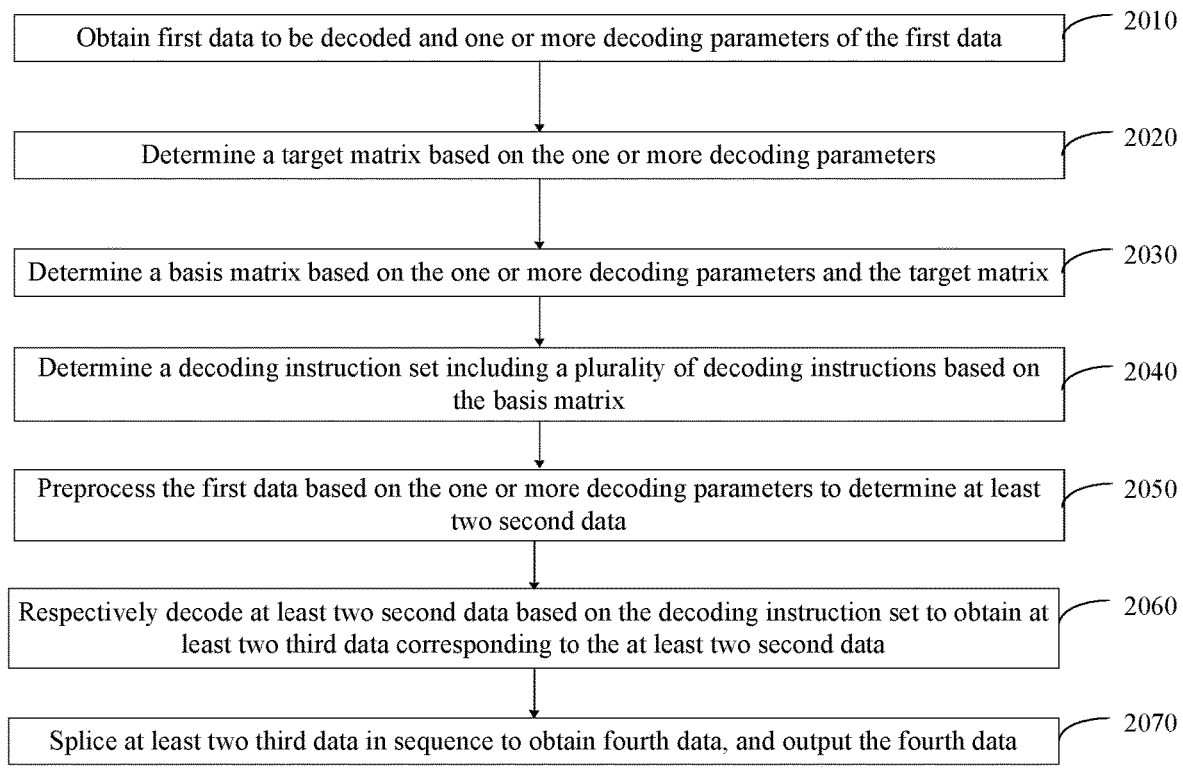
FIG. 2 is a flowchart of another information processing method provided by an embodiment of the present application.

Based on the above embodiments, some embodiments of the present application provide an information processing method, which is performed by the information processing device. As shown in FIG. 2, the method includes the following operations.

At operation 2010, first data to be decoded and one or more decoding parameters of the first data are obtained.

At operation 2020, a target matrix is determined based on the one or more decoding parameters.

In some embodiments, the operation that the target matrix is determined based on the one or more decoding parameters may be implemented by operation A10 to operation A20.

At operation A10, at least one first initial matrix is determined based on the one or more decoding parameters.

In some embodiments, operation A10 may be realized by operation A110 to operation A120.

At operation A110, a first basis matrix and at least one first expansion factor are determined based on the one or more decoding parameters, wherein the at least one first expansion factor corresponds to the first basis matrix.

In the embodiments of the present application, the number of rows and the number of columns of the first basis matrix, as well as the distribution of 0 elements and 1 elements in the first basis matrix can be determined based on the one or more decoding parameters.

At operation A120, at least one first initial matrix is determined based on the one or more decoding parameters, the first basis matrix and at least one first expansion factor.

In some embodiments, there is a correspondence between the at least one first initial matrix and the at least one first expansion factor, and a position of a first type of element of the first initial matrix in the first initial matrix is the same as a position of a second type of element of the first basis matrix in the first basis matrix. The first expansion factor has a correspondence with the first initial matrix. The first expansion factor is used to expand the first initial matrix corresponding to the first expansion factor.

Based on the above embodiments, in some other embodiments of the present application, the information processing method may further include the following operations.

At operation A130, a first characteristic parameter of the first basis matrix is stored to a first storage area.

In some embodiments, the operation that the first characteristic parameter of the first basis matrix is stored to the first storage area may include that: a sum of elements in each row of the first basis matrix is calculated to obtain a weight value of the elements in each row of the first basis matrix;

and the weight value of the elements in each row of the first basis matrix is stored to the first storage area.

For example, for the basis matrix $$H0 = \begin{bmatrix} 0 & 1 & 0 & 1 \\ 0 & 0 & 1 & 0 \\ 1 & 1 & 1 & 1 \\ 1 & 1 & 1 & 0 \end{bmatrix},$$

the weight value of the elements in the first row is 2, the weight value of the elements in the second row is 1, the weight value of the elements in the third row is 4, and the weight value of the elements in the fourth row is 3. The information processing device may store 2, 1, 4, and 3 to the first storage area.

In some embodiments of the present application, the first storage area is a storage area in a register. In some other embodiments, the first storage area may be a storage area in a hard disk or a magnetic disk, which is not limited here.

At operation A140, a second characteristic parameter of the first basis matrix and a third characteristic parameter of the at least one first initial matrix are stored to a second storage area.

In some embodiments, there is a mapping relationship between the first characteristic parameter and the second characteristic parameter, and there is a mapping relationship between the second characteristic parameter and the third characteristic parameter.

The operation that the second characteristic parameter of the first basis matrix and the third characteristic parameter of the at least one first initial matrix are stored to the second storage area may include that: a column serial number of a first target element, whose element value is a preset value, in the first basis matrix is stored to the second storage area; and a second target element, whose column serial number is the column serial number of the first target element, in each first initial matrix is obtained, and the second target element is stored to the second storage area. The weight value of the elements in each row of the first basis matrix has a mapping relationship with the column serial number of the first target element in each row of the first basis matrix, and the column serial number of the first target element in each row of the first basis matrix has a mapping relationship with the second target element in each row of each first initial matrix.

In a feasible implementation, the column serial number of the first target element, whose element value is the preset value, in the first basis matrix is the column serial number of the element whose value is 1 in the first basis matrix. For example, the column serial numbers of the elements, whose values are 1, in the first row of the basis matrix H0 are 2 and 4, and the value 2 stored in the first storage area has a mapping relationship with the column serial numbers 2 and 4, that is, the column serial numbers 2 and 4 in the second storage area can be found through the value 2 in the first storage area. Similarly, the column serial number of the elements, whose values are 1, in the second row is 3, and the column serial number 3 in the second storage area can be found through the value 1 in the first storage area. Similarly, the column serial numbers of the elements, whose values are 1, in the third row is 1, 2, 3 and 4, and the column serial number 1, 2, 3 and 4 in the second storage area can be found through the value 4 in the first storage area. Similarly, the column serial numbers of the elements, whose values are 1, in the fourth row is 1, 2 and 3, and the column serial number 1, 2 and 3 in the second storage area can be found through the value 3 in the first storage area.

In addition, if a first initial matrix obtained based on the one or more decoding parameters and the basis matrix is $$H1 = \begin{bmatrix} -1 & 0 & -1 & 2 \\ -1 & -1 & 1 & -1 \\ 3 & 4 & 8 & 6 \\ 5 & 7 & 9 & -1 \end{bmatrix},$$

the information processing device may store the elements whose values are not −1 in the first initial matrix (including the elements 0 and 2 in the first row, the element 1 in the second row, the elements 3, 4, 8, and 6 in the third row, and the elements 5, 7, and 9 in the fourth row) to the second storage area. The column serial numbers 2 and 4 in the second storage area respectively have a mapping relationship with the elements 0 and 2 in the first row. The column serial number 3 in the second storage area has a mapping relationship with the element 1 in the second row. The column serial numbers 1, 2, 3 and 4 in the second storage area respectively have a mapping relationship with the elements 3, 4, 8 and 6 in the third row. The column serial numbers 1, 2 and 3 in the second storage area respectively have a mapping relationship with the elements 5, 7 and 9 in the fourth row.

The amount of data stored in the second storage area is much larger than the amount of data stored in the first storage area. The second storage area may be a storage area in the hard disk or magnetic disk. In some other embodiments, the first storage area and the second storage area may be set in a storage device.

Referring to FIG. 3, when the basis matrix is distributed as shown in FIG. 3, a sum of elements in each row of the first basis matrix is calculated to obtain the weight value of the elements in each row of the first basis matrix, the weight value of the elements in each row is stored to a weight table (in the first storage area), the column serial number of the elements, whose element values are 1, in each row of the first basis matrix is stored to an element table (in the second storage area), and the elements corresponding to the column serial number in N first initial matrices obtained based on the first basis matrix are stored to the element table. In some embodiments, the column number in FIG. 3 may be the column serial number, Group 1 in FIG. 3 represents the elements corresponding to the column number in the first initial matrix, Group 2 represents the elements corresponding to the column number in the second initial matrix, and GroupN represents the elements corresponding to the column number in the N-th initial matrix.

At operation A20, a target matrix is determined from at least one first initial matrix.

In some embodiments, the operation that the target matrix is determined from at least one first initial matrix may include that: the target matrix is determined from at least one first initial matrix based on the one or more decoding parameters.

In another embodiment, the operation that the target matrix is determined based on the one or more decoding parameters may be implemented by operation B10 to operation B20.

At operation B10, at least one first initial matrix and at least one second initial matrix are determined based on the one or more decoding parameters.

In some embodiments, operation B10 may be realized by operation B110 to operation B130.

At operation B110, a first basis matrix, a second basis matrix, at least one first expansion factor and at least one second expansion factor are determined based on the one or more decoding parameters.

In some embodiments, at least one first expansion factor corresponds to the first basis matrix, and at least one second expansion factor corresponds to the second basis matrix.

The distribution of 0 elements and 1 elements in the first basis matrix is different from the distribution of 0 elements and 1 elements in the second basis matrix.

At operation B120, at least one first initial matrix is determined based on the one or more decoding parameters, the first basis matrix and at least one first expansion factor.

In some embodiments, there is a correspondence between the at least one first initial matrix and the at least one first expansion factor, and a position of a first type of element of the first initial matrix in the first initial matrix is the same as a position of a second type of element of the first basis matrix in the first basis matrix.

At operation B130, at least one second initial matrix is determined based on the one or more decoding parameters, the second basis matrix and at least one second expansion factor.

In some embodiments, there is a correspondence between the at least one second initial matrix and the at least one second expansion factor, and a position of a first type of element of the second initial matrix in the second initial matrix is the same as a position of a second type of element of the second basis matrix in the second basis matrix. The second expansion factor may expand the second initial matrix.

After obtaining the first basis matrix, the second basis matrix, at least one first initial matrix and at least one second initial matrix, the information processing device may store the obtained first basis matrix, second basis matrix, at least one first initial matrix and at least one second initial matrix. The above description of storing the first initial matrix may be used as a reference for how to store. The information processing device may store the first basis matrix, the second basis matrix, at least one first initial matrix and at least one second initial matrix to the first storage area and the second storage area, and may also store the first basis matrix and at least one first initial matrix to the first storage area and the second storage area, and store the second basis matrix and at least one second initial matrix to a third storage area and a fourth storage area.

At operation B20, the target matrix is determined from at least one first initial matrix and at least one second initial matrix.

The operation that the target matrix is determined from at least one first initial matrix and at least one second initial matrix may include that: the target matrix is determined from at least one first initial matrix and at least one second initial matrix based on the one or more decoding parameters.

At operation 2030, the basis matrix is determined based on the one or more decoding parameters and the target matrix.

In some embodiments, the operation that the basis matrix is determined based on the one or more decoding parameters and the target matrix may include that: a target number of rows and a target number of columns are calculated based on the code rate and the data block size in the decoding parameters; and a matrix, whose number of rows is the target number of rows and number of columns is the target number of columns, is obtained from the target matrix to obtain the basis matrix. For example, when the target number of rows and the target number of columns are respectively a and b, the information processing device obtains the matrix whose number of rows is a and number of columns is b from the target matrix to obtain the basis matrix. In an implementation, the information processing device may obtain the elements in rows 1 to a and the elements in columns 1 to b in the target matrix to obtain the basis matrix.

In another embodiment, the operation that the basis matrix is determined based on the one or more decoding parameters and the target matrix may include that: a plurality of target rows and a plurality of target columns are obtained based on the one or more decoding parameters; the weight value of the elements in each of the plurality of target rows of the first basis matrix is obtained from the first storage area; a column serial number of a third target element, whose element value is the preset value, in the plurality of target rows of the first basis matrix is obtained from the second storage area based on the weight value of the elements in each of the plurality of target rows; a fourth target element, whose column serial number is the column serial number of the third target element, in the plurality of target rows of the target matrix is obtained from the second storage area; and the basis matrix is determined based on the fourth target element.

In some embodiments, the first target element includes the third target element. The second target element may include the fourth target element. In some embodiments, the first target element and the third target element are the elements whose values are 1 in the first basis matrix, and the second target element and the fourth target element are the elements whose values are not −1 (or the elements whose values are greater than or equal to 0) in the target matrix.

At operation 2040, the decoding instruction set including the plurality of decoding instructions is determined based on the basis matrix.

In some embodiments, the plurality of decoding instructions are used to call the valid element in the basis matrix.

In some embodiments, the operation that the decoding instruction set including the plurality of decoding instructions is determined based on the basis matrix may be implemented by operation C10 to operation C20.

At operation C10, at least one decoding instruction corresponding to the elements in each row of the basis matrix is determined based on the one or more decoding parameters and elements in each row of the basis matrix.

In some embodiments, the operation that the at least one decoding instruction corresponding to the elements in each row of the basis matrix is determined based on the one or more decoding parameters and the elements in each row of the basis matrix may include that: at least one decoding instruction is determined based on the decoding parallelism in the one or more decoding parameters and the elements in each row of the basis matrix.

In some embodiments, the operation that at least one decoding instruction is determined based on the decoding parallelism in the one or more decoding parameters and the elements in each row of the basis matrix may be implemented by operation C110 to operation C120.

At operation C110, the elements in each row of the basis matrix and a column serial number of each element in the elements in each row are obtained.

The operation that the elements in each row of the basis matrix and the column serial number of each element in the elements in each row are obtained may include that: a third type of elements in each row of the basis matrix and a column serial number of each of the third type of elements are obtained. In some embodiments, the third type of elements in each row of the basis matrix may be non-zero elements in each row of the basis matrix. The non-zero elements are the elements whose values are not 0 (or whose values are 1).

At operation C120, at least one decoding instruction is determined based on the decoding parallelism, the elements in each row and the column serial number of each element in the elements in each row.

The operation that at least one decoding instruction is determined based on the decoding parallelism, the elements in each row and the column serial number of each element in the elements in each row may include that: at least one decoding instruction is determined based on the decoding parallelism, the third type of elements and the column serial number of each of the third type of elements.

In some exemplary implementations, the operation that at least one decoding instruction is determined based on the decoding parallelism, the third type of elements and the column serial number of each of the third type of elements may include that: a first valid element and a second valid element are obtained, the first valid element being the element with the smallest column serial number of the third type of elements in each row of the basis matrix, and the second valid element being the element with the largest column serial number of the third type of elements in each row of the basis matrix; and at least one decoding instruction is determined based on the decoding parallelism, the first valid element, the second valid element, the third type of elements and the column serial number of each of the third type of elements.

In some exemplary implementations, the operation that at least one decoding instruction is determined based on the decoding parallelism, the first valid element, the second valid element, the third type of elements and the column serial number of each of the third type of elements may include that: an execution character and a reserved character are set, the execution character being a first preset character of the decoding instruction, and the reserved character being a second preset character of the decoding instruction; a shift value of the third type of element is determined based on the decoding parallelism and the third type of elements; and at least one decoding instruction is determined based on the execution character, the reserved character, the first valid element, the second valid element, the column serial number of each of the third type of elements and the shift value of the third type of element. A storage format of the decoding instruction is that the execution character, the reserved character, the first valid element, the second valid element, the column serial number of each of the third type of elements and the shift value of the third type of element are arranged in sequence. In the embodiments of the present application, the execution character is used to represent whether the decoding instruction including the execution character is executed. The reserved character is a preset character, and a user may set the reserved character according to actual needs.

In some exemplary implementations, the operation that the shift value of the third type of element is determined based on the decoding parallelism and the third type of elements may also include that: the shift value of the third type of element is determined based on the decoding parallelism, the expansion factor and the third type of elements.

At operation C20, the decoding instruction set is obtained based on at least one decoding instruction.

Referring to FIG. 4, the decoding instruction set includes a plurality of decoding instructions, and the storage format of each decoding instruction is that the execution character (Enable(nop)), the reserved character (rev), the first valid element (rowSop), the second valid element (rowEop), the column serial number (colID) of each of the third type of elements and the shift value (Shift) of each of the third type of elements are arranged in sequence. If the execution character in a decoding instruction is a first character, it is indicated that the decoding instruction may be executed. If the execution character in a decoding instruction is a second character, it is indicated that the decoding instruction may not be executed. The first character may be 1, and the second character may be 0. The reserved character is a preset character, and the user may set the value of the reserved character according to the actual situation. The number of decoding instructions N in the decoding instruction set in FIG. 4 may be determined based on the decoding parallelism (or the decoding cycle) and the number of rows of the basis matrix.

At operation 2050, the first data is preprocessed based on the one or more decoding parameters to determine at least two second data.

The operation that the first data is preprocessed to determine at least two second data may include that: the first data is partitioned based on the one or more decoding parameters to obtain at least two second data. In some embodiments, the operation that the first data is partitioned based on the one or more decoding parameters to obtain at least two second data may include that: the first data is partitioned based on the data block size in the one or more decoding parameters to obtain at least two second data, so that the size of the second data is equal to the data block size in the one or more decoding parameters. For example, if the data block size in the one or more decoding parameters is 512 bit, then the size of the second data should also be 512 bit.

At operation 2060, at least two second data are respectively decoded based on the decoding instruction set to obtain at least two third data corresponding to the at least two second data.

After calling the decoding instruction set and decoding a second datum based on the decoding instruction set, the information processing device may call the decoding instruction set again and decode the next second datum based on the decoding instruction set.

The operation that at least two second data are respectively decoded based on the decoding instruction set may include that: the valid elements in the basis matrix are called based on the decoding instruction set, the decoding matrix is generated based on the valid elements, and at least two second data are decoded based on the decoding matrix. The decoding matrix may use a hard decision decoding or soft decision decoding method to decode the second data.

At operation 2070, at least two third data are spliced in sequence to obtain fourth data, and the fourth data is output.

The third data may include identification information used for representing the sequence of data. The information processing device may splice, based on the identification information, at least two third data in sequence to obtain the fourth data, and output the fourth data.

The descriptions of the same operations and contents in the present embodiment as in other embodiments may refer to the descriptions in other embodiments and will not be repeated here.

The information processing method provided by the embodiments of the present application can flexibly determine, based on the first data to be decoded and the one or more decoding parameters of the first data during decoding, the decoding instruction set used to decode the first data, so that when the first data is decoded through the decoding instruction set, the problem that when the decoding parameter corresponding to the data to be decoded is not a predetermined decoding parameter, decoding cannot be performed or decoding performance cannot be met can be addressed. Therefore, the information processing method provided by the embodiments of the present application can improve the accuracy of decoding and meet the decoding performance for different decoding parameters. In addition, because the basis matrix and the initial matrix are stored to the first storage area and the second storage area, and the information processing device can obtain the basis matrix by calling the data in the first storage area and the second storage area, and obtain only valid information, which is the elements whose values are not −1, in the basis matrix, the storage space and power consumption of the information processing device may be saved.

Figure 5:
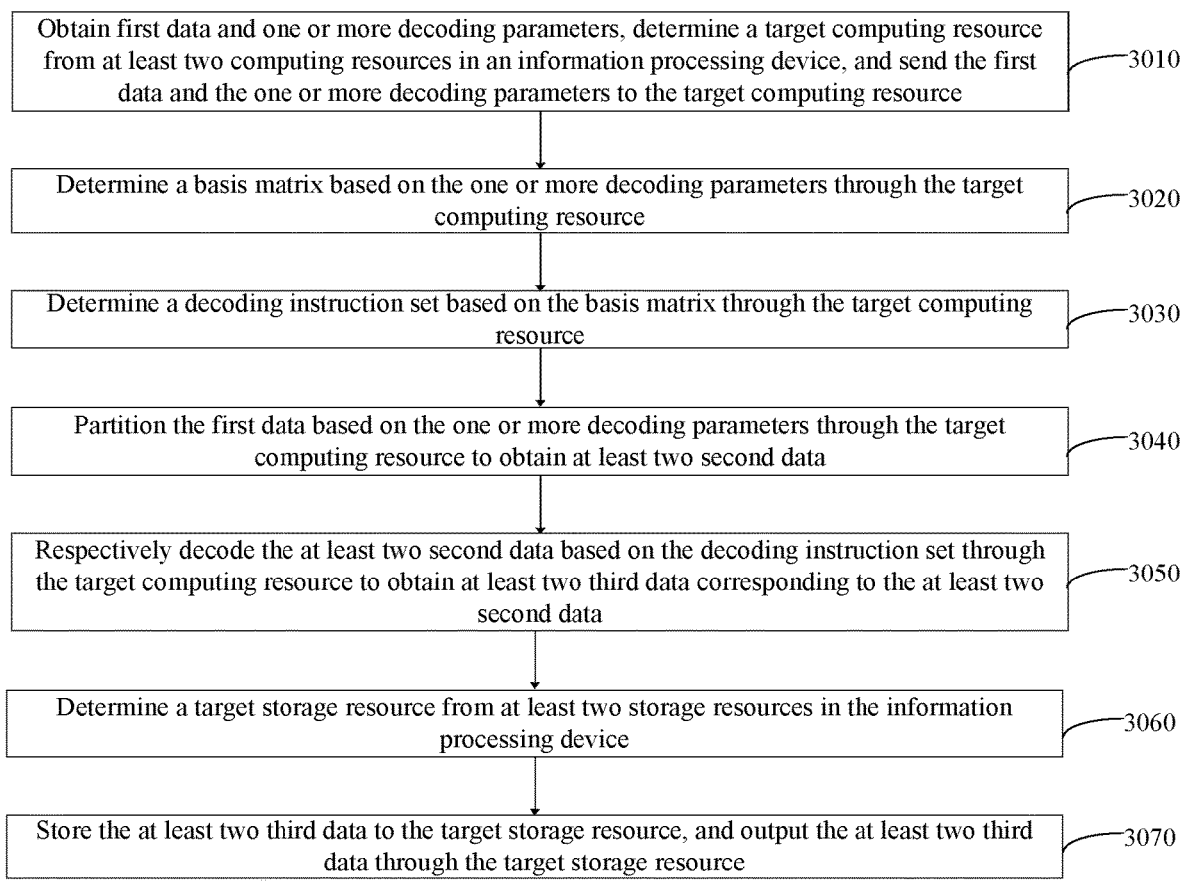
FIG. 5 is a flowchart of another information processing method provided by an embodiment of the present application.

Based on the above embodiments, some embodiments of the present application provide an information processing method, which is performed by the information processing device. As shown in FIG. 5, the method includes the following operations.

At operation 3010, the first data and the one or more decoding parameters are obtained, a target computing resource is determined from at least two computing resources in the information processing device, and the first data and the one or more decoding parameters are sent to the target computing resource.

The information processing device may set a first priority of at least two computing resources and determine the target computing resource from the at least two computing resources based on the first priority. The at least two computing resources are in a computing resource pool.

At operation 3020, the basis matrix is determined based on the one or more decoding parameters through the target computing resource.

That is, the operation that the basis matrix is determined based on the one or more decoding parameters is performed through the target computing resource in the information processing device.

At operation 3030, the decoding instruction set is determined based on the basis matrix through the target computing resource.

In some embodiments, the decoding instruction set includes a plurality of decoding instructions, and the decoding instructions are used to call the valid elements in the basis matrix.

That is, the operation that the decoding instruction set is determined based on the basis matrix is performed through the target computing resource in the information processing device.

At operation 3040, the first data is partitioned based on the one or more decoding parameters through the target computing resource to obtain at least two second data.

That is, the operation that the first data is partitioned based on the one or more decoding parameters to obtain at least two second data is performed through the target computing resource in the information processing device.

In some exemplary implementations, the operation that the first data is partitioned based on the one or more decoding parameters through the target computing resource to obtain at least two second data may include that: after the first data is preprocessed based on one or more decoding parameters through the target computing resource, fifth data is obtained, and the fifth data is partitioned to obtain at least two second data. In some embodiments, the operation that the first data is preprocessed may include that: a padding part of the first data is processed according to the maximum positive value, and the first data is symmetrically saturated.

In some embodiments, the execution of operation 3020 and operation 3030 by the target computing resource is synchronous with the execution of operation 3040 by the target computing resource. That is, the target computing resource may execute operation 3040 while executing operation 3020 and operation 3030.

At operation 3050, at least two second data are respectively decoded based on the decoding instruction set through the target computing resource to obtain at least two third data corresponding to the at least two second data.

The target computing resource may output at least two third data after obtaining the at least two third data. In some embodiments, the output of at least two third data may be either an in-order output or an out-of-order output, which is not limited here.

At operation 3060, the target storage resource is determined from at least two storage resources in the information processing device.

The information processing device may set a second priority of each of the at least two storage resources, and determine a target storage resource from the at least two storage resources in it based on the second priority.

At operation 3070, at least two third data are stored to the target storage resource, and the at least two third data are output through the target storage resource.

In some embodiments, the operation that at least two third data are stored to the target storage resource, and the at least two third data are output through the target storage resource may include that: the at least two third data are stored to a target resource pool, the at least two third data output from the target resource pool are spliced in sequence to obtain fourth data, and the fourth data is output.

The descriptions of the same operations and contents in the present embodiment as in other embodiments may refer to the descriptions in other embodiments and will not be repeated here.

The information processing method provided by the embodiments of the present application can flexibly determine, based on the first data to be decoded and the one or more decoding parameters of the first data during decoding, the decoding instruction set used to decode the first data, so that when the first data is decoded through the decoding instruction set, the problem that when the decoding parameter corresponding to the data to be decoded is not a predetermined decoding parameter, decoding cannot be performed or decoding performance cannot be met can be addressed. Therefore, the information processing method provided by the embodiments of the present application can improve the accuracy of decoding and meet the decoding performance for different decoding parameters.

Figure 6:
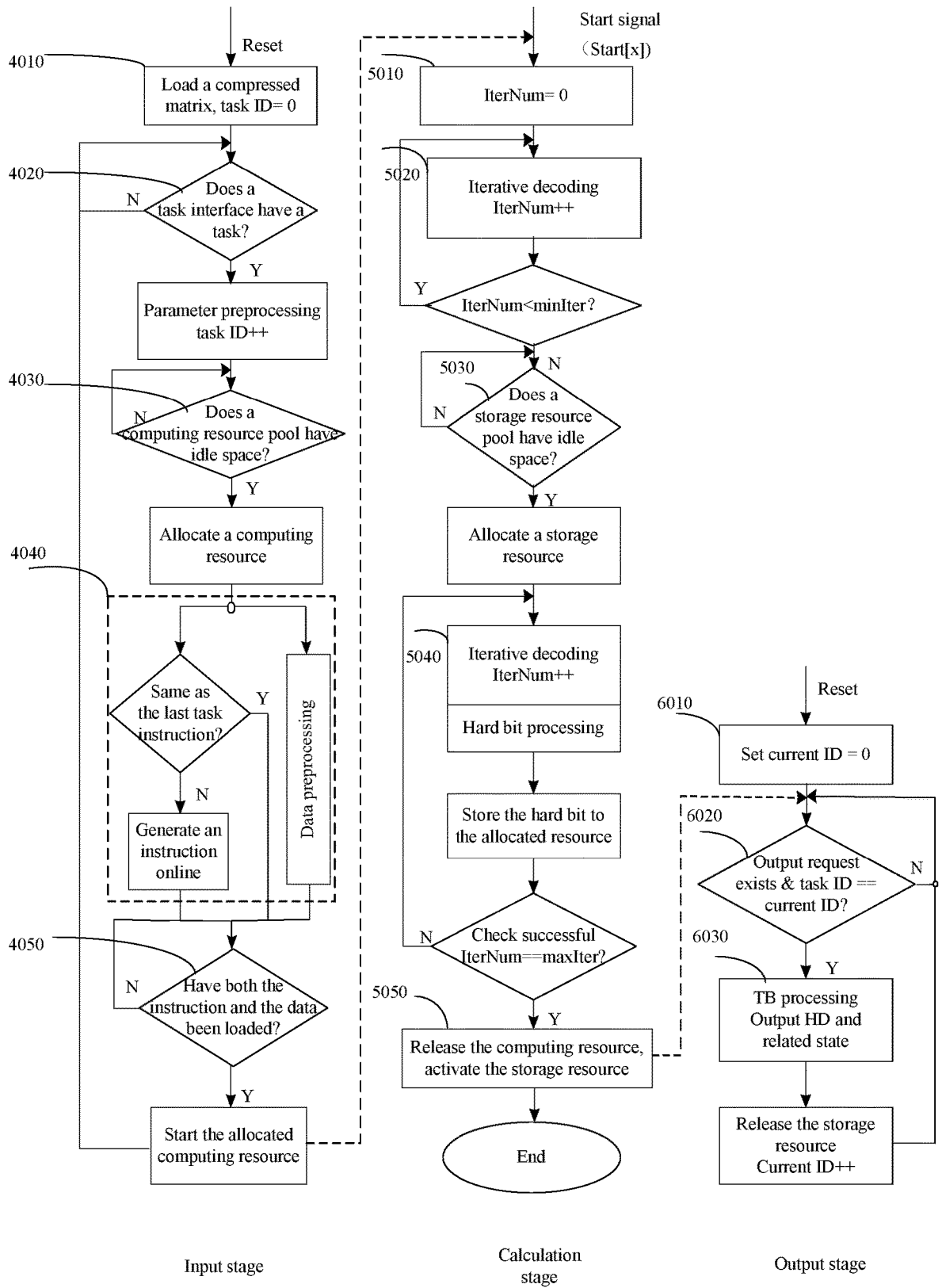
FIG. 6 is a flowchart of another information processing method provided by an embodiment of the present application.

Based on the above embodiments, some embodiments of the present application provide an information processing method, which is performed by the information processing device. As shown in FIG. 6, the method includes operations in an input stage, a calculation stage and an output stage.

Figure 7:
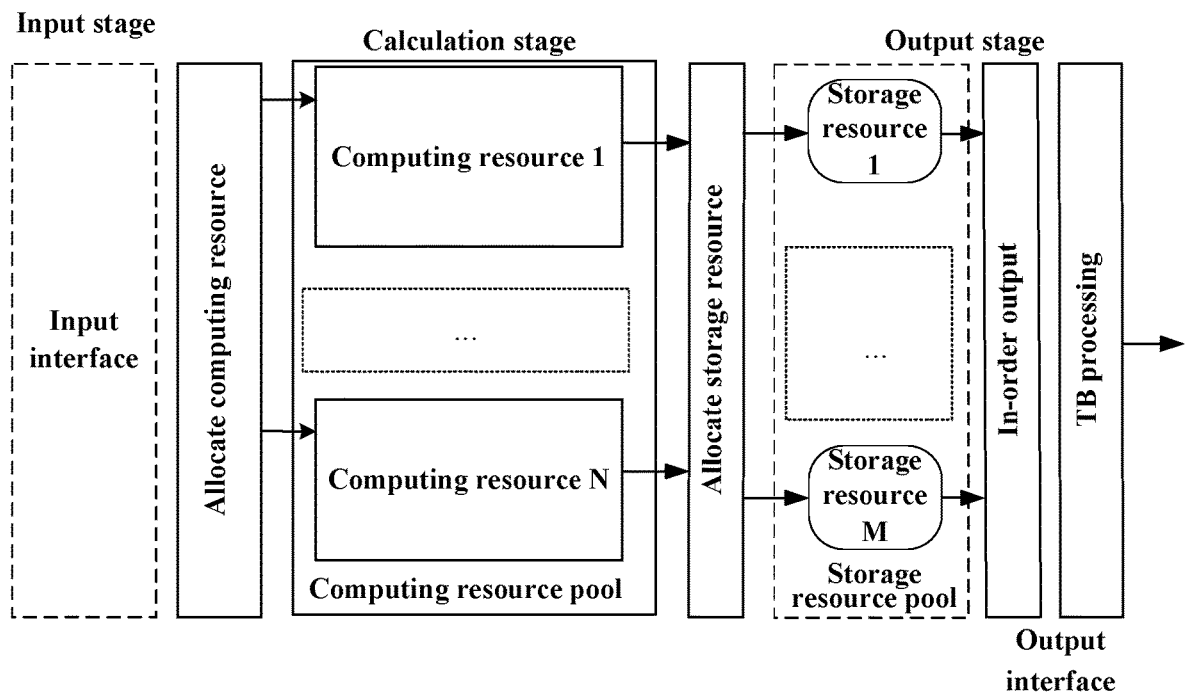
FIG. 7 is a structure diagram of an information processing device provided by an embodiment of the present application.

Before the operations of the embodiment are described, referring to FIG. 7, the information processing device includes an input interface, a computing resource pool, a storage resource pool, and an output interface.

The input stage may include the following operations.

In some embodiments, the input stage is the operations performed before the information processing device decodes. operation 4010 to operation 4050 may be performed through the input interface of the information processing device.

At operation 4010, after a LDPC decoder is powered on and reset, high-level software loads, through an external interface, the original basis matrix into a Random Access Memory (RAM) in hardware in a compressed format, informs the hardware of the storage format of the basis matrix in a way of static configuration, such as a weight bit width, an Identifier (ID) bit width, a shift bit width and the number of shift sets, and at the same time, initializes a task ID (TaskID) to 0. Then, operation 4020 is performed.

The original basis matrix here may be the first basis matrix in the above embodiments, the high-level software may be a processor in the information processing device, the weight bit width may be the number of bytes occupied by the weight value, the ID bit width may be the number of bytes occupied by the identity of the target matrix, the shift bit width may be the number of bytes occupied by the shift value, and the shift set may be the value of the shift value.

At operation 4020, it is determined whether a task interface has a task request; if the task interface does not have the task request, return to operation 4010 and continue to wait; and if the task interface has the task request, a task is received, fault-tolerant processing is performed on the parameters used in decoding and a required intermediate value is calculated, and then enter operation 4030.

The task request here may be the first data in the above embodiment. operation 4020 may also include that the one or more decoding parameters for decoding the first data are obtained.

At operation 4030, it is determined whether there is idle computing resource in the computing resource pool; if there is no idle computing resource in the computing resource pool, return to operation 4030 and continue to wait; if there is any idle computing resource in the computing resource pool, the idle resource is allocated to the task according to a certain allocation algorithm (e.g. polling), and then jump to operation 4040.

Operation 4040 mainly includes two parallel processes, that is, data preprocessing and instruction loading.

1) In the process of data preprocessing, data received from the interface is restored according to Z, and the input original data is preprocessed according to algorithm requirements, for example, the padding part is processed according to the maximum positive value, and all data are symmetrically saturated. After that, jump to operation 4050.

The Z here is the expansion factor in the above embodiment. The operation that the data received from the interface is restored according to Z may be that the first data is partitioned based on the data block size in the one or more decoding parameters. In some embodiments, the data block size should be an integer multiple of the expansion factor.

2) In the process of instruction loading, if two processing tasks to which a set of computing resources is allocated need different instruction programs, such as the different basis matrix IDs, Z and code rates, then the instruction programs of the tasks are generated online from a basis matrix RAM and written into a local instruction RAM, and jump to operation 4050; if the two processing tasks to which the set of computing resource is allocated need the same instruction program, directly jump to operation 4050.

The basis matrix ID here may be either the first basis matrix identity or the second basis matrix identity.

At operation 4050, if the above two parallel processes are completed, it is indicated that all parameters and data required by the task are ready, that is, the execution of the set of computing resources may be started, and jump back to operation 4020 and continue to receive a new task request of the input interface.

After the information processing device obtains the data which can perform the decoding process, enter the calculation stage. The calculation stage includes multiple sets of computing resources. Without loss of generality, any set x (the decoding process of any computing resource) in the multiple sets of computing resources is taken as an example for illustration. The computing resource mainly includes the following operations.

Operation 5010 to operation 5050 may be performed through the target computing resource. The target computing resource is set in the computing resource pool.

At operation 5010, after a start signal Start[x] in the preceding stage is received, it is indicated that all parameters and data required by the computing resource have been loaded, and iterative decoding may be started. The number of initialization iterations is 0, and enter operation 5020.

Before operation 5010, the information processing device may also perform a step of allocating the computing resource, that is, the target computing resource x is determined from at least two computing resources, so that the target computing resource can receive the start signal Start [x] in the preceding stage.

At operation 5020, an iterative calculation is completed, that is, all the instructions are read from the instruction RAM, a round of processing is completed, the number of iterations is increased progressively, and it is determined whether the number of iterations is less than the minimum number of iterations required by the system; if the number of iterations is less than the minimum number of iterations required by the system, it is indicated that there is no need to decode and store a hard bit, then directly return to operation 5020 to continue a new round of iterative calculation; and if the number of iterations is not less than the minimum number of iterations required by the system, jump to operation 5030.

At operation 5030, it is determined whether the storage resource is idle, and if not, wait in a loop until it is idle; if the storage resource is idle, the idle storage resource is allocated to the task, and then jump to operation 5040 to continue a new round of iterative calculation.

At operation 5040, same as operation 5020, an iteration calculation is completed and the number of iterations is increased progressively, the hard bit is decoded and relevant check processing (Check and CB CRC calculation) is performed, and the hard bit is output to the allocated storage resource RAM. Then, it is determined whether the iteration is stopped, that is, it is determined, according to the system requirements, whether the number of iterations is equal to the maximum number of iterations or whether the check is successful; if an iteration stop criterion is met, jump to operation 5050; and if the iteration stop criterion is not met, jump back to operation 5040 to continue the iteration calculation.

At operation 5050, the computing resources are released, that is, the state of the set of computing resources is marked as idle (IDLE), and the storage resources are activated, that is, a request for data output is made to the output interface.

The output stage mainly includes the following operations.

Operation 6010 to operation 6030 may be performed through the storage resource and the output interface. The storage resource is set in the storage resource pool.

At operation 6010, after powering on and resetting, the current ID (CurrID) is initialized to 0, so that it corresponds to the TaskID in the input phase for an order-preserving purpose. Then, enter operation 6020.

Before operation 6010, the information processing device may perform a step of allocating the storage resource, that is, the target storage resource is determined from at least two storage resources, At operation 6020, it is determined whether there is an output request, and if there is an order-preserving requirement, it is also needed to determine whether the CurrID is the same as the requested TaskID. If the output request does not meet these conditions, return to operation 6020 and continue to wait; and if the output request meets these conditions, jump to operation 6030.

At operation 6030, relevant output parameters and data are read from the corresponding storage resource, the processing of Transport Block (TB) splicing and TB Cycling Redundancy Check (CRC) is performed on the data according to the parameters, and relevant data and state information are output through the external interface. Then, return to operation 6020 for the processing of the next output task.

Figure 8:
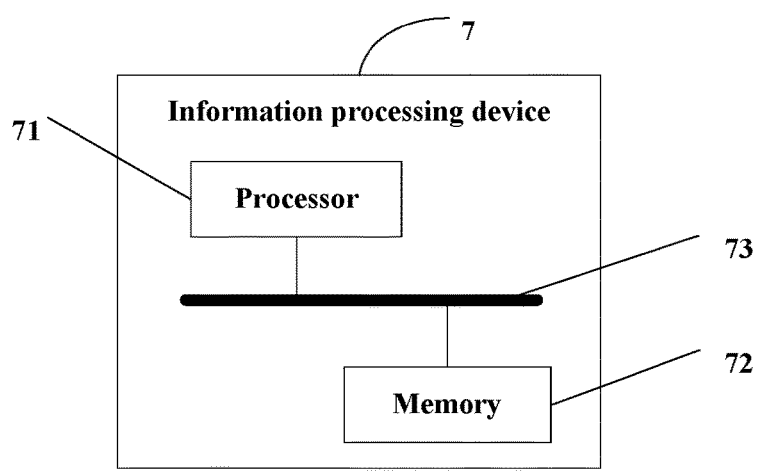
FIG. 8 is a structure diagram of another information processing device provided by an embodiment of the present application.

Based on the above embodiments, an embodiment of the present application provides an information processing device 7. The information processing device may be applied to an information processing method provided by the embodiments corresponding to FIG. 1, FIG. 2, FIG. 5 and FIG. 6. As shown in FIG. 8, the information processing device may include: a processor 71, a memory 72 and a communication bus 73.

The communication bus 73 is configured to realize a communication connection between the processor 71 and the memory 72.

The processor 71 is configured to execute a program of the information processing method stored in the memory 72 to implement the following operations: the first data to be decoded and the one or more decoding parameters of the first data during decoding are obtained; the basis matrix is determined based on the one or more decoding parameters; the decoding instruction set including the plurality of decoding instructions is determined based on the basis matrix, the plurality of decoding instructions being used to call the element in the basis matrix; and the first data is decoded based on the decoding instruction set.

In some other embodiments of the present application, the processor 71 is configured to perform the operation of determining the basis matrix based on the one or more decoding parameters stored in the memory 72 to implement the following operations: the target matrix is determined based on the one or more decoding parameters; and the basis matrix is determined based on the one or more decoding parameters and the target matrix.

In some other embodiments of the present application, the processor 71 is configured to perform the operation of determining the target matrix based on the one or more decoding parameters stored in the memory 72 to implement the following operations: at least one first initial matrix is determined based on the one or more decoding parameters; and the target matrix is determined from the at least one first initial matrix.

In some other embodiments of the present application, the processor 71 is configured to perform the operation of determining at least one first initial matrix based on the one or more decoding parameters stored in the memory 72 to implement the following operations: the first basis matrix and at least one first expansion factor are determined based on the one or more decoding parameters, wherein the at least one first expansion factor corresponds to the first basis matrix; and the at least one first initial matrix is determined based on the one or more decoding parameters, the first basis matrix and the at least one first expansion factor. There is a correspondence between the at least one first initial matrix and the at least one first expansion factor, and a position of a first type of element of the first initial matrix in the first initial matrix is the same as a position of a second type of element of the first basis matrix in the first basis matrix.

In some other embodiments of the present application, the processor 71 is configured to perform the information processing method stored in the memory 72 to implement the following operations: the first characteristic parameter of the first basis matrix is stored to the first storage area; and the second characteristic parameter of the first basis matrix and the third characteristic parameter of the at least one first initial matrix are stored to the second storage area. There is a mapping relationship between the first characteristic parameter and the second characteristic parameter, and there is a mapping relationship between the second characteristic parameter and the third characteristic parameter.

In some other embodiments of the present application, the processor 71 is configured to perform the operation of storing the first characteristic parameter of the first basis matrix to the first storage area stored in the memory 72 to implement the following operations: a sum of elements in each row of the first basis matrix is calculated to obtain the weight value of the elements in each row of the first basis matrix; and the weight value of the elements in each row of the first basis matrix is stored to the first storage area.

In some other embodiments of the present application, the processor 71 is configured to perform the operation of storing the second characteristic parameter of the first basis matrix and the third characteristic parameter of the at least one first initial matrix to the second storage area stored in the memory 72 to implement the following operations: the column serial number of the first target element, whose element value is the preset value, in the first basis matrix is stored to the second storage area; and the second target element, whose column serial number is the column serial number of the first target element, in each first initial matrix is obtained, and the second target element is stored to the second storage area. The weight value of the elements in each row of the first basis matrix has a mapping relationship with the column serial number of the first target element in each row of the first basis matrix, and the column serial number of the first target element in each row of the first basis matrix has a mapping relationship with the second target element in each row of each first initial matrix.

In some other embodiments of the present application, the processor 71 is configured to perform the operation of determining the basis matrix based on the one or more decoding parameters and the target matrix stored in the memory 72 to implement the following operations: a plurality of target rows and a plurality of target columns are obtained based on the one or more decoding parameters; the weight value of the elements in each of the plurality of target rows of the first basis matrix is obtained from the first storage area; the column serial number of the third target element, whose element value is the preset value, in the plurality of target rows of the first basis matrix is obtained from the second storage area based on the weight value of the elements in each of the plurality of target rows; the fourth target element, whose column serial number is the column serial number of the third target element, in the plurality of target rows of the target matrix is obtained from the second storage area; and the basis matrix is determined based on the fourth target element.

In some other embodiments of the present application, the processor 71 is configured to perform the operation of determining the target matrix based on the one or more decoding parameters stored in the memory 72 to implement the following operations: at least one first initial matrix and at least one second initial matrix are determined based on the one or more decoding parameters; and the target matrix is determined from the at least one first initial matrix and the at least one second initial matrix.

In some other embodiments of the present application, the processor 71 is configured to perform the operation of determining at least one first initial matrix and at least one second initial matrix based on the one or more decoding parameters stored in the memory 72 to implement the following operations: a first basis matrix, a second basis matrix, at least one first expansion factor and at least one second expansion factor are determined based on the one or more decoding parameters, wherein the at least one first expansion factor corresponds to the first basis matrix, and the at least one second expansion factor corresponding to the second basis matrix; at least one first initial matrix is determined based on the one or more decoding parameters, the first basis matrix and the at least one first expansion factor, the first initial matrix having a correspondence with the first expansion factor, and a position of a first type of element of the first initial matrix in the first initial matrix being the same as a position of a second type of element of the first basis matrix in the first basis matrix; and at least one second initial matrix is determined based on the one or more decoding parameters, the second basis matrix and the at least one second expansion factor, the second initial matrix having a correspondence with the second expansion factor, and a position of a first type of element of the second initial matrix in the second initial matrix being the same as a position of a second type of element of the second basis matrix in the second basis matrix.

In some other embodiments of the present application, the processor 71 is configured to perform the operation of determining the basis matrix based on the one or more decoding parameters and the target matrix stored in the memory 72 to implement the following operations: a target number of rows and a target number of columns are calculated based on the code rate and the data block size in the decoding parameters; and the matrix, whose number of rows is the target number of rows and number of columns is the target number of columns, is obtained from the target matrix to obtain the basis matrix.

In some other embodiments of the present application, the processor 71 is configured to perform the operation of determining the decoding instruction set including the plurality of decoding instructions based on the basis matrix stored in the memory 72 to implement the following operations: the at least one decoding instruction corresponding to the elements in each row of the basis matrix is determined based on the one or more decoding parameters and elements in each row of the basis matrix; and the decoding instruction set is obtained based on at least one decoding instruction.

In some other embodiments of the present application, the processor 71 is configured to perform the operation of determining the at least one decoding instruction corresponding to the elements in each row of the basis matrix based on the one or more decoding parameters and the elements in each row of the basis matrix stored in the memory 72 to implement the following operations: at least one decoding instruction is determined based on the decoding parallelism in the one or more decoding parameters and elements in each row of the basis matrix.

In some other embodiments of the present application, the processor 71 is configured to perform the operation of determining at least one decoding instruction based on the decoding parallelism in the one or more decoding parameters and the elements in each row of the basis matrix stored in the memory 72 to implement the following operations: the elements in each row of the basis matrix and a column serial number of each element in the elements in each row are obtained; and at least one decoding instruction is determined based on the decoding parallelism, the elements in each row and the column serial number of each element in the elements in each row.

In some other embodiments of the present application, the processor 71 is configured to perform the operation of obtaining the elements in each row of the basis matrix and the column serial number of each element in the elements in each row stored in the memory 72 to implement the following operations: a third type of elements in each row of the basis matrix and a column serial number of each of the third type of elements are obtained. Correspondingly, the processor 71 is configured to perform the operation of determining at least one decoding instruction based on the decoding parallelism, the elements in each row and the column serial number of each element in the elements in each row stored in the memory 72 to implement the following operations: at least one decoding instruction is determined based on the decoding parallelism, the third type of elements and the column serial number of each of the third type of elements.

In some other embodiments of the present application, the processor 71 is configured to perform the operation of determining at least one decoding instruction based on the decoding parallelism, the third type of elements and the column serial number of each of the third type of elements stored in the memory 72 to implement the following operations: the first valid element and the second valid element are obtained, the first valid element being the element with the smallest column serial number of the third type of elements in each row of the basis matrix, and the second valid element being the element with the largest column serial number of the third type of elements in each row of the basis matrix; and at least one decoding instruction is determined based on the decoding parallelism, the first valid element, the second valid element, the third type of elements and the column serial number of each of the third type of elements.

In some other embodiments of the present application, the processor 71 is configured to perform the operation of determining at least one decoding instruction based on the decoding parallelism, the first valid element, the second valid element, the third type of elements and the column serial number of each of the third type of elements stored in the memory 72 to implement the following operations: the execution character and the reserved character are set, the execution character being the first preset character of the decoding instruction, and the reserved character being the second preset character of the decoding instruction; the shift value of the third type of elements is determined based on the decoding parallelism and the third type of elements; and at least one decoding instruction is determined based on the execution character, the reserved character, the first valid element, the second valid element, the column serial number of each of the third type of elements and the shift value of the third type of elements. The storage format of the decoding instruction is that the execution character, the reserved character, the first valid element, the second valid element, the column serial number of each of the third type of elements and the shift value of the third type of elements are arranged in sequence.

In some other embodiments of the present application, the processor 71 is configured to perform the operation of decoding the first data based on the decoding instruction set stored in the memory 72 to implement the following operations: the first data is preprocessed based on the one or more decoding parameters to determine at least two second data; and the at least two second data are respectively decoded based on the decoding instruction set to obtain at least two third data corresponding to the at least two second data.

In some other embodiments of the present application, the processor 71 is configured to perform the operation of preprocessing the first data to determine at least two second data stored in the memory 72 to implement the following operations: the first data is partitioned based on the one or more decoding parameters to obtain the at least two second data.

In some other embodiments of the present application, the processor 71 is configured to perform the information processing method stored in the memory 72 to implement the following operations: the at least two third data are spliced in sequence to obtain fourth data, and the fourth data is output.

In some other embodiments of the present application, the processor 71 is configured to perform the operation of obtaining the first data to be decoded and the one or more decoding parameters of the first data during decoding stored in the memory 72 to implement the following operations: the first data and the one or more decoding parameters are obtained, the target computing resource is determined from at least two computing resources in the information processing device, and the first data and the one or more decoding parameters are sent to the target computing resource. Correspondingly, the processor 71 is configured to perform the operation of determining the basis matrix based on the one or more decoding parameters stored in the memory 72 to implement the following operations: the basis matrix is determined based on the one or more decoding parameters through the target computing resource.

In some other embodiments of the present application, the processor 71 is configured to perform the operation of determining the decoding instruction set including the plurality of decoding instructions based on the basis matrix stored in the memory 72 to implement the following operations: the decoding instruction set is determined based on the basis matrix through the target computing resource. Correspondingly, the processor 71 is configured to perform the operation of decoding the first data based on the decoding instruction set stored in the memory 72 to implement the following operations: the first data is partitioned based on the one or more decoding parameters through the target computing resource to obtain at least two second data; and the at least two second data are respectively decoded based on the decoding instruction set through the target computing resource to obtain at least two third data corresponding to the at least two second data.

In some other embodiments of the present application, the processor 71 is configured to perform the operation of respectively decoding the at least two second data based on the decoding instruction set through the target computing resource to obtain at least two third data corresponding to the at least two second data stored in the memory 72 to implement the following operations: the target storage resource is determined from at least two storage resources in the information processing device; and the at least two third data are stored to the target storage resource, and the at least two third data are output through the target storage resource.

In some other embodiments of the present application, the processor 71 is configured to perform the operation of storing the at least two third data to the target storage resource, and outputting the at least two third data through the target storage resource stored in the memory 72 to implement the following operations: the at least two third data are stored to the target resource pool, the at least two third data output from the target resource pool are spliced in sequence to obtain fourth data, and the fourth data is output.

The implementation process of the information processing method provided by the embodiments corresponding to FIG. 1, FIG. 2, FIG. 5 and FIG. 6 may be used as a reference for the implementation process of the operations performed by the processor in the embodiment and will not be described here.

The information processing method provided by the embodiments of the present application can flexibly determine, based on the first data to be decoded and the one or more decoding parameters of the first data during decoding, the decoding instruction set used to decode the first data, so that when the first data is decoded through the decoding instruction set, the problem that when the decoding parameter corresponding to the data to be decoded is not a predetermined decoding parameter, decoding cannot be performed or decoding performance cannot be met can be addressed. Therefore, the information processing method provided by the embodiments of the present application can improve the accuracy of decoding and meet the decoding performance for different decoding parameters.

Based on the above embodiments, an embodiment of the present application provides a computer-readable storage medium, which stores one or more than one program. The one or more than one program may be executed by one or more than one processor to implement the information processing method in any above embodiment.

The processor may be at least one of Application Specific Integrated Circuit (ASIC), Digital Signal Processor (DSP), Digital Signal Processing Device (DSPD), Programmable Logic Device (PLD), Field Programmable Gate Array (FPGA), Central Processing Unit (CPU), controller, micro control unit and microprocessor. There may also be other electronic devices for realizing functions of the above processor, which is not limited by the embodiments of the present application.

The above computer storage medium/memory may be a Read Only Memory (ROM), a Programmable Read-Only Memory (PROM), an Erasable Programmable Read-Only Memory (EPROM), an Electrically Erasable Programmable Read-Only Memory (EEPROM), a Ferromagnetic Random Access Memory (FRAM), a flash memory, a magnetic surface storage, a compact disc, or a Compact Disc Read-Only Memory (CD-ROM), and may also be an information processing device including one or any combination of the above memories.

Terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the present application are just for describing, instead of representing superiority-inferiority of the embodiments.

Through the above description of implementations, the method in the embodiments may be implemented by means of software plus a necessary common hardware platform, certainly by means of hardware. The technical solution of the present application may be embodied in the form of a software product. The software product is stored in a storage medium (such as a ROM/RAM, a floppy disk and a compact disc), and includes a plurality of instructions to make an information processing device perform the method described in the embodiments of the present application.

The present application is described with reference to flowcharts and/or block diagrams of the method, the device (system) and the computer program product according to the embodiments of the present application. Each flow and/or block in the flowchart and/or block diagram, and the combination of the flow and/or block in the flowchart and/or block diagram can be implemented by the computer program instructions. These computer program instructions can be provided to a processor of a general-purpose computer, a special-purpose computer, an embedded processor or other programmable data processing devices to generate a machine, so that instructions which are executed by the processor of the computer or other programmable data processing devices generate a device which is used for implementing the specified functions in one or more flows of the flowchart and/or one or more blocks of the block diagram.

These computer program instructions may also be stored in the computer-readable memory which can guide the computer or other programmable data processing devices to work in a particular way, so that the instructions stored in the computer-readable memory generate a product including an instruction device. The instruction device implements the specified functions in one or more flows of the flowchart and/or one or more blocks of the block diagram.

These computer program instructions may also be loaded on the computer or other programmable data processing devices, so that a series of operation operations are performed on the computer or other programmable data processing devices to generate the processing implemented by the computer, and the instructions executed on the computer or other programmable data processing devices provide the operations for implementing the specified functions in one or more flows of the flowchart and/or one or more blocks of the block diagram.

What is claimed is:

1. An information processing method performed by an information processing device comprising an allocate computing resource, a computing resource pool, and an allocate storage resource having a first storage area and second storage area, the method comprising:
    obtaining first data to be decoded and one or more decoding parameters of the first data through a decoding device;
    determining a basis matrix based on the one or more decoding parameters;
    determining a decoding instruction set comprising a plurality of decoding instructions based on the basis matrix, wherein the plurality of decoding instructions are used to call elements in the basis matrix; and
    decoding the first data based on the decoding instruction set;
    wherein determining the basis matrix based on the one or more decoding parameters comprises:
    determining a first basis matrix and at least one first expansion factor based on the one or more decoding parameters, wherein the at least one first expansion factor corresponds to the first basis matrix; and
    determining at least one first initial matrix based on the one or more decoding parameters, the first basis matrix and the at least one first expansion factor;
    determining a target matrix from the at least one first initial matrix;
    determining the basis matrix based on the one or more decoding parameters and the target matrix;
    wherein after determining the at least one first initial matrix based on the one or more decoding parameters, the first basis matrix and the at least one first expansion factor, the method further comprises:
    calculating a sum of elements in each row of the first basis matrix to obtain a weight value of the elements in each row of the first basis matrix; and
    storing the weight value of the elements in each row of the first basis matrix to the first storage area.

2. The method according to claim 1,
    wherein there is a correspondence between the at least one first initial matrix and the at least one first expansion factor, wherein the first expansion factor is used to expand the first initial matrix corresponding to the first expansion factor; positions of a first type of elements of the first initial matrix in the first initial matrix are the same as positions of a second type of elements of the first basis matrix in the first basis matrix, wherein the first type of elements of the first initial matrix refers to elements which are not −1 in the first initial matrix, and the second type of elements of the first basis matrix refers to elements which are equal to 1 in the first basis matrix.

3. The method according to claim 2, wherein after determining the at least one first initial matrix based on the one or more decoding parameters, the first basis matrix and the at least one first expansion factor, the method further comprises:
    storing a second characteristic parameter of the first basis matrix and a third characteristic parameter of the at least one first initial matrix to a second storage area,
    wherein there is a mapping relationship between a first characteristic parameter and the second characteristic parameter, and there is a mapping relationship between the second characteristic parameter and the third characteristic parameter, wherein the first characteristic parameter is the weight value of the elements in each row of the first basis matrix, the second characteristic parameter is a column serial number of a first target element, whose element value is a preset value, in the i-th row of the first basis matrix, the third characteristic parameter is the column serial number in the i-th row of each first initial matrix.

4. The method according to claim 3, wherein storing the second characteristic parameter of the first basis matrix and the third characteristic parameter of the at least one first initial matrix to the second storage area comprises:
    storing a column serial number of a first target element to the second storage area, wherein the first target element refers to an element, whose element value is a preset value, in the i-th row of the first basis matrix;
    obtaining a second target element, and storing the second target element to the second storage area, wherein the second target element refers to an element, whose column serial number is the column serial number of the first target element in the i-th row of the first basis matrix, in the i-th row of each first initial matrix;
    wherein the weight value of the elements in the i-th row of the first basis matrix has a mapping relationship with the column serial number of the first target element in the i-th row of the first basis matrix, and the column serial number of the first target element in the i-th row of the first basis matrix has a mapping relationship with the second target element in the i-th row of each first initial matrix, where i is a positive integer.

5. The method according to claim 4, wherein determining the basis matrix based on the one or more decoding parameters and the target matrix comprises:
   obtaining a plurality of target rows based on the one or more decoding parameters;
   obtaining from the first storage area the weight value of the elements in the j-th target row of the first basis matrix;
   based on the weight value of the elements in the j-th target row of the first basis matrix, obtaining from the second storage area a column serial number of a third target element, wherein the third target element refers to an element, whose element value is the preset value, in the j-th target row of the first basis matrix;
   obtaining from the second storage area a fourth target element, wherein the fourth target element refers to an element, whose column serial number is the column serial number of the third target element in the j-th target row of the first basis matrix, in the j-th target row of the target matrix, where j is a positive integer; and
   determining the basis matrix based on fourth target elements corresponding to the plurality of target rows in the target matrix.

6. The method according to claim 1, wherein determining the target matrix based on the one or more decoding parameters comprises:
   determining the at least one first initial matrix and at least one second initial matrix based on the one or more decoding parameters; and
   determining the target matrix from the at least one first initial matrix and the at least one second initial matrix.

7. The method according to claim 6, wherein determining the at least one first initial matrix and the at least one second initial matrix based on the one or more decoding parameters comprises:
   determining the first basis matrix, a second basis matrix, the at least one first expansion factor and at least one second expansion factor based on the one or more decoding parameters, wherein the at least one first expansion factor corresponds to the first basis matrix, and the at least one second expansion factor corresponds to the second basis matrix, the first expansion factor is used to expand the first initial matrix corresponding to the first expansion factor, and the second expansion factor is used to expand the second initial matrix corresponding to the second expansion factor;
   determining the at least one first initial matrix based on the one or more decoding parameters, the first basis matrix and the at least one first expansion factor, wherein there is a correspondence between the at least one first initial matrix and the at least one first expansion factor, and positions of a first type of elements of the first initial matrix in the first initial matrix are the same as positions of a second type of elements of the first basis matrix in the first basis matrix, wherein the first type of elements of the first initial matrix refers to elements which are not −1 in the first initial matrix, and the second type of elements of the first basis matrix refers to elements which are equal to 1 in the first basis matrix; and
   determining the at least one second initial matrix based on the one or more decoding parameters, the second basis matrix and the at least one second expansion factor, wherein there is a correspondence between the at least one second initial matrix and the at least one second expansion factor, and positions of a first type of elements of the second initial matrix in the second initial matrix are the same as positions of a second type of elements of the second basis matrix in the second basis matrix, wherein the first type of elements of the second initial matrix refers to elements which are not −1 in the second initial matrix, and the second type of elements of the second basis matrix refers to elements which are equal to 1 in the second basis matrix.

8. The method according to claim 1, wherein determining the basis matrix based on the one or more decoding parameters and the target matrix comprises:
   calculating a target number of rows and a target number of columns based on a code rate and a data block size in the decoding parameters; and
   obtaining a matrix, whose number of rows is the target number of rows and number of columns is the target number of columns, from the target matrix to obtain the basis matrix.

9. The method according to claim 1, wherein determining the decoding instruction set comprising the plurality of decoding instructions based on the basis matrix comprises:
   determining, based on the one or more decoding parameters and elements in each row of the basis matrix, at least one decoding instruction corresponding to the elements in each row of the basis matrix; and
   obtaining the decoding instruction set based on the at least one decoding instruction corresponding to the elements in each row of the basis matrix.

10. The method according to claim 9, wherein determining, based on the one or more decoding parameters and the elements in each row of the basis matrix, the at least one decoding instruction corresponding to the elements in each row of the basis matrix comprises:
    determining, based on decoding parallelism in the one or more decoding parameters and the elements in each row of the basis matrix, the at least one decoding instruction corresponding to the elements in each row of the basis matrix.

11. The method according to claim 10, wherein determining, based on the decoding parallelism in the one or more decoding parameters and the elements in each row of the basis matrix, the at least one decoding instruction corresponding to the elements in each row of the basis matrix comprises:
    obtaining the elements in each row of the basis matrix and a column serial number of each element in the elements in each row; and
    determining the at least one decoding instruction corresponding to the elements in each row based on the decoding parallelism in the one or more decoding parameters, the elements in each row and the column serial number of each element in the elements in each row.

12. The method according to claim 11, wherein obtaining the elements in each row of the basis matrix and the column serial number of each element in the elements in each row comprises:
    obtaining a third type of elements in each row of the basis matrix and a column serial number of each of the third type of elements, wherein the third type of elements in each row of the basis matrix is non-zero elements in each row of the basis matrix; and determining the at least one decoding instruction corresponding to the elements in each row based on the decoding parallelism in the one or more decoding parameters, the elements in each row and the column serial number of each element in the elements in each row comprises:

determining the at least one decoding instruction corresponding to the elements in each row based on the decoding parallelism in the one or more decoding parameters, the third type of elements and the column serial number of each of the third type of elements.

13. The method according to claim 12, wherein determining the at least one decoding instruction corresponding to the elements in each row based on the decoding parallelism in the one or more decoding parameters, the third type of elements and the column serial number of each of the third type of elements comprises:

obtaining a first valid element and a second valid element, wherein the first valid element is an element with the smallest column serial number of the third type of elements in each row of the basis matrix, and the second valid element is an element with the largest column serial number of the third type of elements in each row of the basis matrix; and determining the at least one decoding instruction corresponding to the elements in each row based on the decoding parallelism in the one or more decoding parameters, the first valid element, the second valid element, the third type of elements and the column serial number of each of the third type of elements.

14. The method according to claim 13, wherein determining the at least one decoding instruction corresponding to the elements in each row based on the decoding parallelism in the one or more decoding parameters, the first valid element, the second valid element, the third type of elements and the column serial number of each of the third type of elements comprises:

setting an execution character and a reserved character, wherein the execution character is a first preset character of the decoding instruction, and the reserved character is a second preset character of the decoding instruction;

determining a shift value of each of the third type of elements based on the decoding parallelism in the one or more decoding parameters and the third type of elements; and determining the at least one decoding instruction corresponding to the elements in each row based on the execution character, the reserved character, the first valid element, the second valid element, the column serial number of each of the third type of elements and the shift value of each of the third type of elements;

wherein a storage format of each decoding instruction is that the execution character, the reserved character, the first valid element, the second valid element, the column serial number of each of the third type of elements and the shift value of each of the third type of elements are arranged in sequence.

15. The method according to claim 1, wherein decoding the first data based on the decoding instruction set comprises:

preprocessing the first data based on the one or more decoding parameters to determine at least two second data; and decoding the at least two second data respectively based on the decoding instruction set to obtain at least two third data corresponding to the at least two second data.

16. The method according to claim 15, wherein preprocessing the first data based on the one or more decoding parameters to determine the at least two second data comprises:

partitioning the first data based on the one or more decoding parameters to obtain the at least two second data;

or, after decoding the at least two second data respectively based on the decoding instruction set to obtain the at least two third data corresponding to the at least two second data, the method further comprises:

splicing the at least two third data in sequence to obtain fourth data, and outputting the fourth data.

17. The method according to claim 1, wherein obtaining the first data to be decoded and the one or more decoding parameters of the first data comprises:

obtaining the first data to be decoded and the one or more decoding parameters of the first data, determining a target computing resource from at least two computing resources in an information processing device, and sending the first data and the one or more decoding parameters to the target computing resource; and determining the basis matrix based on the one or more decoding parameters comprises:

determining, through the target computing resource, the basis matrix based on the one or more decoding parameters.

18. The method according to claim 17, wherein determining the decoding instruction set comprising the plurality of decoding instructions based on the basis matrix comprises:

determining, through the target computing resource, the decoding instruction set comprising the plurality of decoding instructions based on the basis matrix;

decoding the first data based on the decoding instruction set comprises:

partitioning, through the target computing resource, the first data based on the one or more decoding parameters to obtain the at least two second data;

decoding, through the target computing resource, the at least two second data respectively based on the decoding instruction set to obtain at least two third data corresponding to the at least two second data.

19. The method according to claim 18, wherein after decoding, through the target computing resource, the at least two second data respectively based on the decoding instruction set to obtain the at least two third data corresponding to the at least two second data, the method further comprises:

determining a target storage resource from at least two storage resources in the information processing device;

storing the at least two third data to the target storage resource, and outputting the at least two third data through the target storage resource.

20. The method according to claim 19, wherein storing the at least two third data to the target storage resource, and outputting the at least two third data through the target storage resource comprises:

storing the at least two third data to a target resource pool, splicing the at least two third data output from the target resource pool in sequence to obtain fourth data, and outputting the fourth data.

21. A non-transitory computer storage medium, storing one or more than one program; the one or more than one program, when being executed by one or more than one processor, causes the one or more than one processor to perform the method as claimed in claim 1.

22. An information processing device, comprising:
a processor, a memory, a communication bus, and an allocate storage resource having a first storage area;
the communication bus is configured to realize a communication connection between the processor and the memory;
the processor is configured to execute a program of an information processing method in the memory to:
obtain first data to be decoded and one or more decoding parameters of the first data through a decoding device;
determine a basis matrix based on the one or more decoding parameters;
determine a decoding instruction set comprising a plurality of decoding instructions based on the basis matrix, wherein the plurality of decoding instructions are used to call elements in the basis matrix; and
decode the first data based on the decoding instruction set;
wherein the processor, when being configured to determine the basis matrix based on the one or more decoding parameters, is configured to:
determine a first basis matrix and at least one first expansion factor based on the one or more decoding parameters, wherein the at least one first expansion factor corresponds to the first basis matrix; and
determine at least one first initial matrix based on the one or more decoding parameters, the first basis matrix and the at least one first expansion factor;
determine a target matrix from the at least one first initial matrix; determine the basis matrix based on the one or more decoding parameters and the target matrix;
wherein after determining the at least one first initial matrix based on the one or more decoding parameters, the first basis matrix and the at least one first expansion factor, the processor is further configured to:
calculate a sum of elements in each row of the first basis matrix to obtain a weight value of the elements in each row of the first basis matrix; and
store the weight value of the elements in each row of the first basis matrix to the first storage area.

* * * * *